(12) United States Patent
Kocaman et al.

(10) Patent No.: US 7,456,690 B2
(45) Date of Patent: Nov. 25, 2008

(54) AUTOMATIC GAIN CONTROL USING MULTI-COMPARATORS

(75) Inventors: Namik Kemal Kocaman, Irvine, CA (US); Afshin Momtaz, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 78 days.

(21) Appl. No.: 11/135,208

(22) Filed: May 23, 2005

(65) Prior Publication Data

US 2006/0261895 A1 Nov. 23, 2006

(51) Int. Cl.
*H03G 3/10* (2006.01)
(52) U.S. Cl. ...................................... 330/279; 330/129
(58) Field of Classification Search ................. 330/279, 330/140, 85; 375/345; 455/234.1
See application file for complete search history.

(56) References Cited

U.S. PATENT DOCUMENTS

| | | | |
|---|---|---|---|
| 5,548,833 A * | 8/1996 | Townsend | ................ 455/234.1 |
| 5,659,582 A | 8/1997 | Kojima et al. | |
| 6,081,656 A | 6/2000 | Marandi et al. | |
| 6,240,934 B1 | 6/2001 | Durst et al. | |
| 6,259,682 B1 * | 7/2001 | Brown et al. | ................ 370/311 |
| 6,420,934 B1 * | 7/2002 | Butler et al. | ................ 330/279 |
| 6,862,327 B2 * | 3/2005 | Van Sinderen | ............. 375/345 |
| 6,968,163 B2 * | 11/2005 | Kuechler et al. | ........... 455/126 |
| 6,980,053 B2 * | 12/2005 | Caresosa et al. | ............ 330/254 |
| 7,013,117 B2 * | 3/2006 | Darabi | .................... 455/240.1 |
| 7,065,336 B2 * | 6/2006 | Spiegel | .................... 455/244.1 |
| 7,113,758 B2 * | 9/2006 | Kishi | ....................... 455/234.1 |
| 2003/0139160 A1 | 7/2003 | Yang | |
| 2003/0202496 A1 | 10/2003 | Kluge et al. | |
| 2006/0216042 A1 * | 9/2006 | Yeo et al. | .................... 398/209 |

* cited by examiner

*Primary Examiner*—Robert Pascal
*Assistant Examiner*—Hieu P Nguyen

(57) ABSTRACT

A method and apparatus for an automatic gain control (AGC) loop that utilizes multiple comparators to provide constant bandwidth tracking and step response, as well as fine granularity for decision directed convergence. In one embodiment, an odd number of comparators is used with square-law scaling at the output to achieve constant bandwidth step response for a wide range of input amplitude changes.

18 Claims, 7 Drawing Sheets

AUTOMATIC GAIN CONTROL USING MULTI-COMPARATORS

FIELD OF THE INVENTION

This application is related to an automatic gain control (AGC), and more particularly to an AGC with multiple comparators.

BACKGROUND OF THE INVENTION

Automatic gain control (AGC) circuits generate a relatively constant output signal amplitude from an input signal with varying amplitude. A typical AGC circuit includes a loop having a variable gain amplifier (VGA). A common application of an AGC circuit is in digital communication systems. An ideal AGC action would provide a constant output for all values of input signal strength. The figure of merit applied to AGC action is given as the change in input required for a given output change.

In high speed (e.g., 10 giga bits per second (Gb/s)), high performance, serial communication receivers that require equalization, VGAs are sometimes used at the front end of the topology. A VGA is used to either provide gain or attenuation depending on the amplitude of the input signal such that the VGA outputs a substantially constant amplitude signal. The ability to adjust the gain/attenuation of the VGA so that both a large and a small input voltage swing range at the input to the receiver can be accommodated is desirable for 10 Gb/s serial data communication applications.

A block diagram of a generic AGC loop 10 is shown in FIG. 1. Amplitude Detector 14 senses the output amplitude Vout 13 of the VGA 12 and generates a voltage that represents the peak voltage of the VGA output $V_{pk}$ 15. A comparator 17 compares the detected amplitude $V_{pk}$ 15 to a reference voltage $V_{ref}$ 16. The reference voltage $V_{ref}$ 16 represents the desired output amplitude of the VGA. Based on the comparison, the comparator 17 generates an error signal 18 and feeds it to an AGC loop filter 19. In other words, comparator 17 determines the difference between the peak voltage $V_{pk}$ 15 and the reference voltage $V_{ref}$ 16, and adaptively adjusts the control voltage Vc 11, such that the VGA 12 produces an output swing that is equal to a predetermined and fixed amplitude required by subsequent circuit blocks.

As shown, in a typical AGC loop, only one comparator is used to gather the amplitude information. However, using one comparator does not provide high resolution since only information for determining whether the output amplitude is above or below a desired signal level is provided by a single comparator. This does not supply information about how far away the output amplitude is from the desired signal level. Furthermore, since this typical scheme is coarse and nonlinear, it does not exhibit constant bandwidth tracking and step response.

To improve the resolution, a high precision analog circuitry, such as log domain amplifier is sometimes utilized to reach the goal of constant bandwidth step response for AGC circuit. See, for example, J. M. Khoury, "On the design of constant settling time AGC circuits", Circuits and Systems II: Analog and Digital Signal Processing, IEEE Transactions, Volume 45, Issue 3, March 1998, p 283-294. However, since such a solution is analog, it has a high complexity and high power consumption.

Therefore, there is a need for an AGC loop which provides a balance between simplicity and accuracy compared to existing schemes.

SUMMARY OF THE INVENTION

In one embodiment, the present invention is a method for controlling gain of a VGA. The method includes: obtaining signal information of the VGA output; quantizing the signal information by a plurality of comparators; scaling the quantized signal information to produce gain control decisions; and adjusting the gain of the VGA responsive to the gain control decisions.

In one embodiment, the present invention is an AGC loop including: a VGA; a peak detector for obtaining signal information of the VGA output; a plurality of comparators for quantizing the signal information; and a loop filter for scaling the quantized signal information to produce gain control decisions and for adjusting the gain of the VGA responsive to the gain control decisions.

The signal information may be one or more of the amplitude, power, root mean square (RMS), and peak of the VGA output.

DETAILED DESCRIPTION

In one embodiment, the present invention is a method and apparatus for an automatic gain control (AGC) loop that utilizes multiple comparators to quantize the amplitude information with respect to predetermined reference levels. Quantized amplitude information is digitally processed in a square-law manner to provide constant bandwidth tracking and step response, as well as fine granularity for decision directed convergence of the AGC loop.

Although in describing the embodiments of the present invention, a digitally controlled VGA and a digital AGC loop are used as examples, a VGA with analog control as well as an analog AGC loop can also be devised which utilize the multiple comparator scheme of the present invention. In such a case, the AGC loop controls the VGA using an analog signal.

Figure 1:
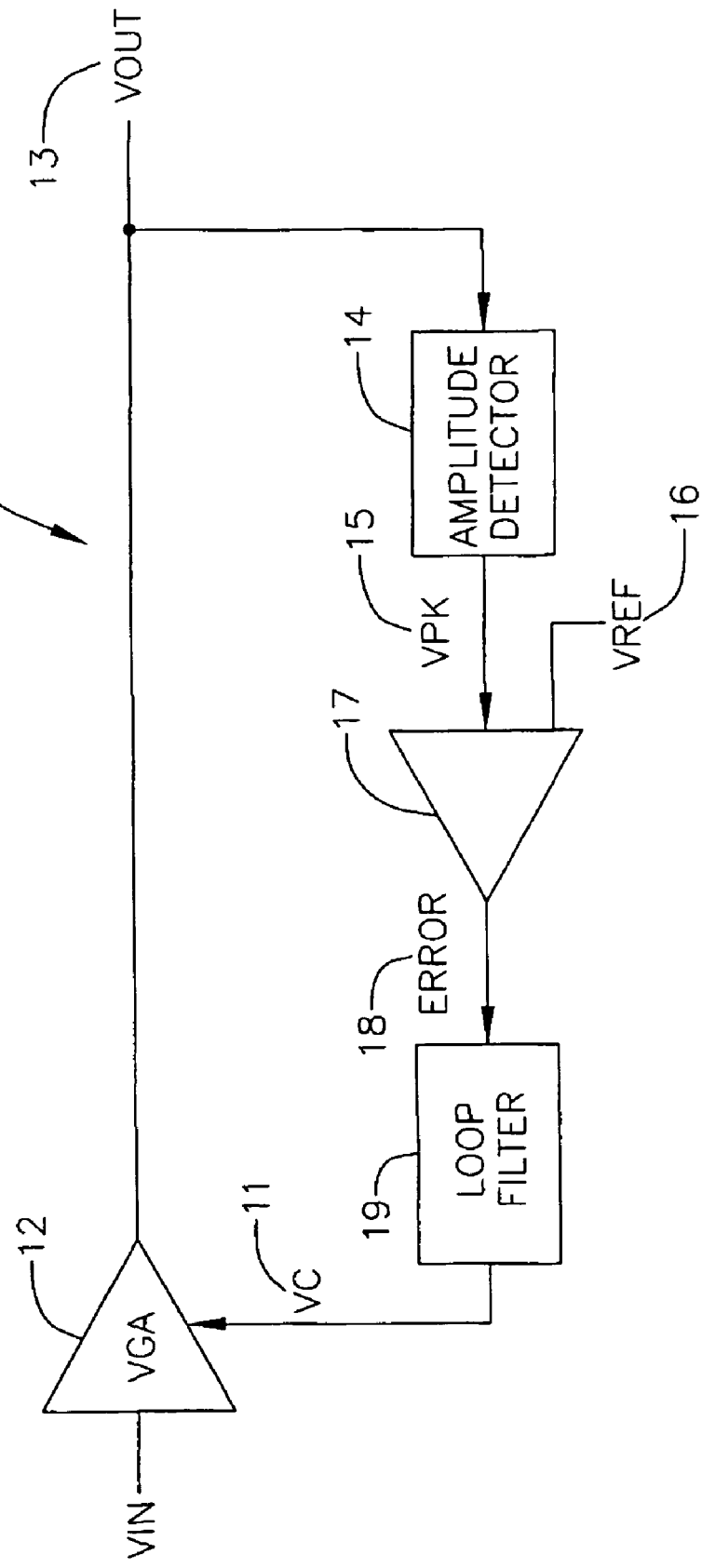
FIG. 1 is a block diagram of a typical AGC loop.
Figure 2:
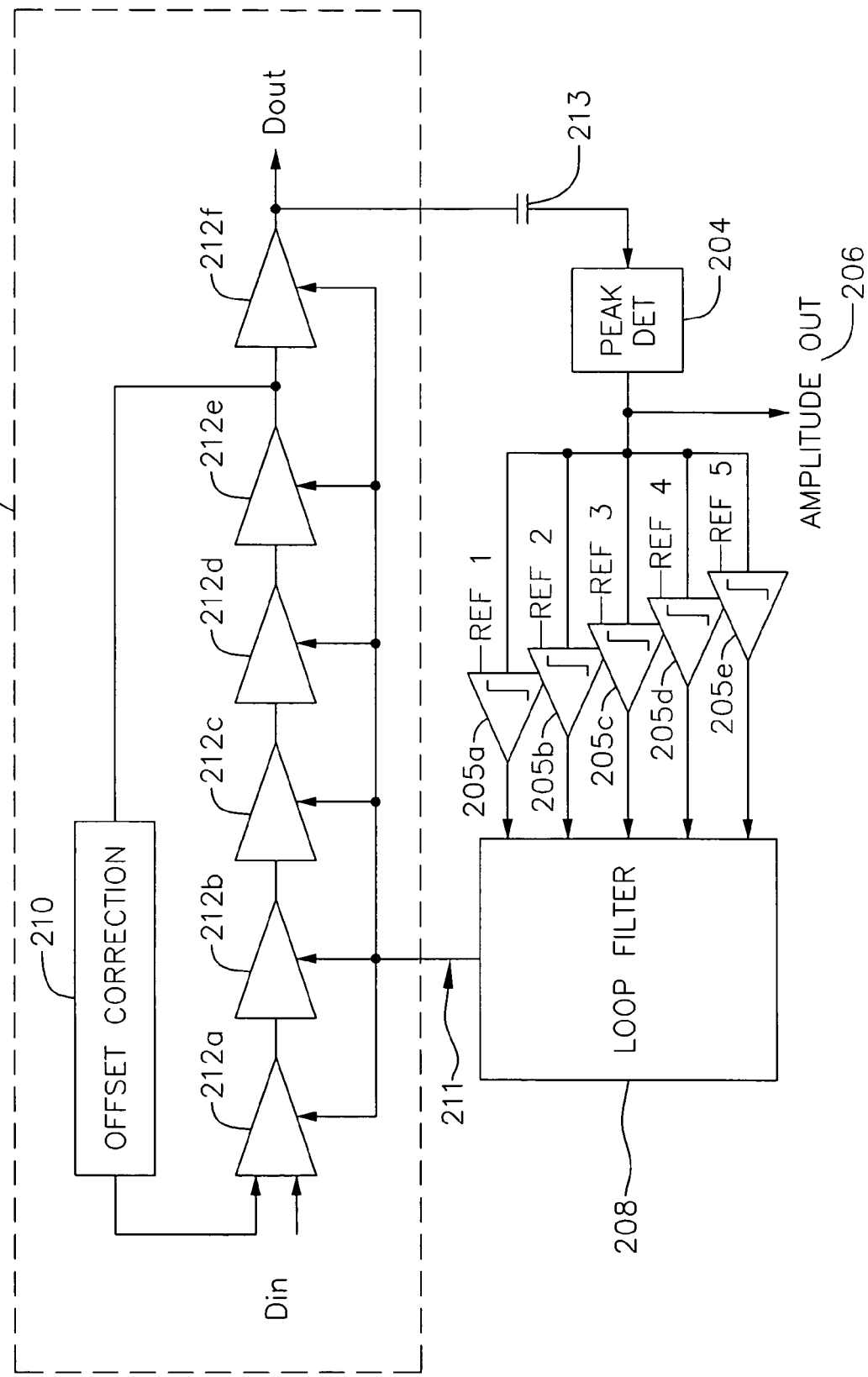
FIG. 2 is an exemplary AGC loop using multiple comparators, according to one embodiment of the present invention.

FIG. 2 is an exemplary AGC loop including a VGA, according to one embodiment of the present invention. As depicted in FIG. 2, five comparators 205a-205e, and a loop filter 208 are utilized to control the output amplitude of a VGA 202. The VGA 202 includes several cascaded stages (212a-212f). In this embodiment, six stages (212a-212f) are used to optimize gain range versus bandwidth requirement. A peak detection circuit 204 takes the filtered output of the VGA (filtered by the capacitor 213) and provides the amplitude information to the comparators 205a-205e.

Comparators 205a-205e compare the amplitude information to respective reference voltages ref1-ref5 and output decisions to the loop filter 208. The loop filter 208 scales the outputs of the comparators and based on certain criteria, generates decision to change (or keep constant) the gain of the VGA 202. The output of the loop filter are scaled VGA gain control codes 211 that are utilized to change the gain of the cascaded stages (212a-212f) of the VGA.

As shown in FIG. 2, an odd number (five) of comparators are utilized. The reference level in the middle (ref3) is the desired signal level at the output of the VGA 202. At the equilibrium, one expects to have the output of the peak detector 204, that is, Amplitude Out 206 to be in the vicinity of ref3. The rest of the reference levels ref1, ref2, ref4, and ref5 represent signal levels above and below the desired signal level, as seen in Table 1 below.

TABLE 1

(Reference levels with respect to percentage of desired signal amplitude)
Reference Level as Percentage of Desired Level

| | |
|---|---|
| Ref1 | 120% |
| Ref2 | 110% |
| Ref3 | 100% |
| Ref4 | 90% |
| Ref5 | 80% |

If Amplitude Out 206 is larger than the desired reference level (i.e., ref 3), a corresponding comparator outputs a logic LOW "0" signal which indicates that the signal amplitude is no longer smaller than the respective reference for the corresponding comparator. For example if Amplitude Out is larger than the desired reference level by 12%, comparator 205b, which has a reference voltage of ref 2 outputs a logic "0" signal, while comparator 205a, which has a reference voltage of ref 1 outputs a logic "1" signal. Comparators 205c to 205e also outputs a logic "0" signal, because their input is larger than their respective reference voltages.

Likewise, if Amplitude Out is smaller than the desired reference level by 15%, comparator 205d, which has a reference voltage of ref 4 outputs a logic "1" signal, while comparator 205e, which has a reference voltage of ref 5 outputs a logic "0" signal. Comparators 205a to 205c also outputs a logic "1" signal, because their input is smaller than their respective reference voltages.

By means of multiple comparators and corresponding reference levels, the circuit obtains the quantized amplitude information in binary format at the outputs of the comparators. The outputs of the comparators are fed into loop filter 208, which processes the quantized amplitude information to adjust the gain of VGA 202.

In applications where input signal amplitude can exhibit large and sudden jumps, such as dense wave division multiplexing (DWDM), and Add/Drop multiplexing in optical communications, one needs to design constant bandwidth tracking and step response for the AGC loop. An ideal way to achieve this task is to utilize a linear AGC loop with an ideal integrator. An ideal integrator possesses infinite gain and infinite input/output signal range. A linear AGC loop with ideal integrator can obtain a relatively well-determined time constant for step responses of various amplitudes.

However, it is not possible to design an ideal integrator. Therefore, the present invention approximates this ideal solution using multi comparators scheme with a first order digital loop filter. In one embodiment, this approximation is achieved by scaling the output from the comparators that are input to the loop filter.

Figure 3A:
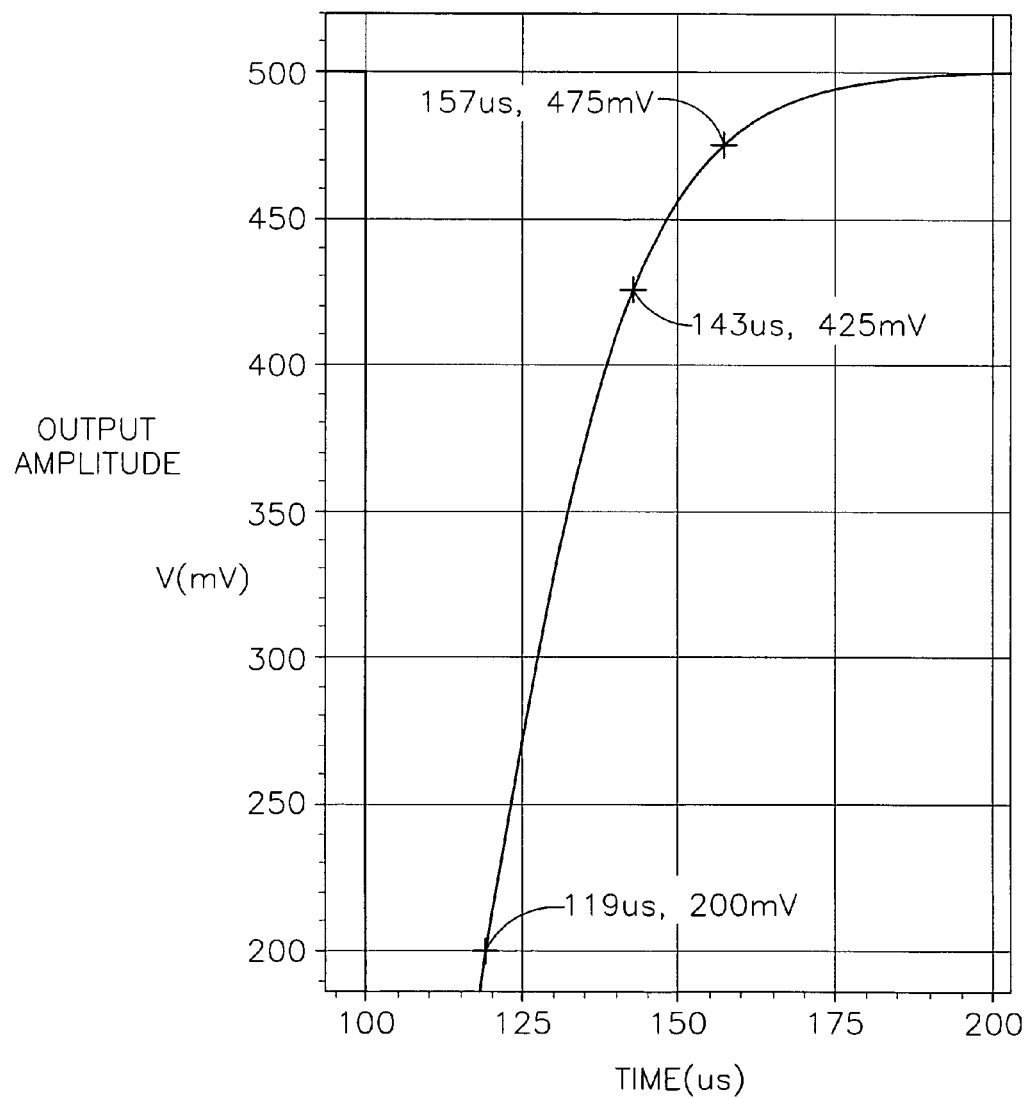
FIGS. 3A and 3B are simulation plots for a linear ramp and its derivative for a five comparator embodiment.
Figure 3B:
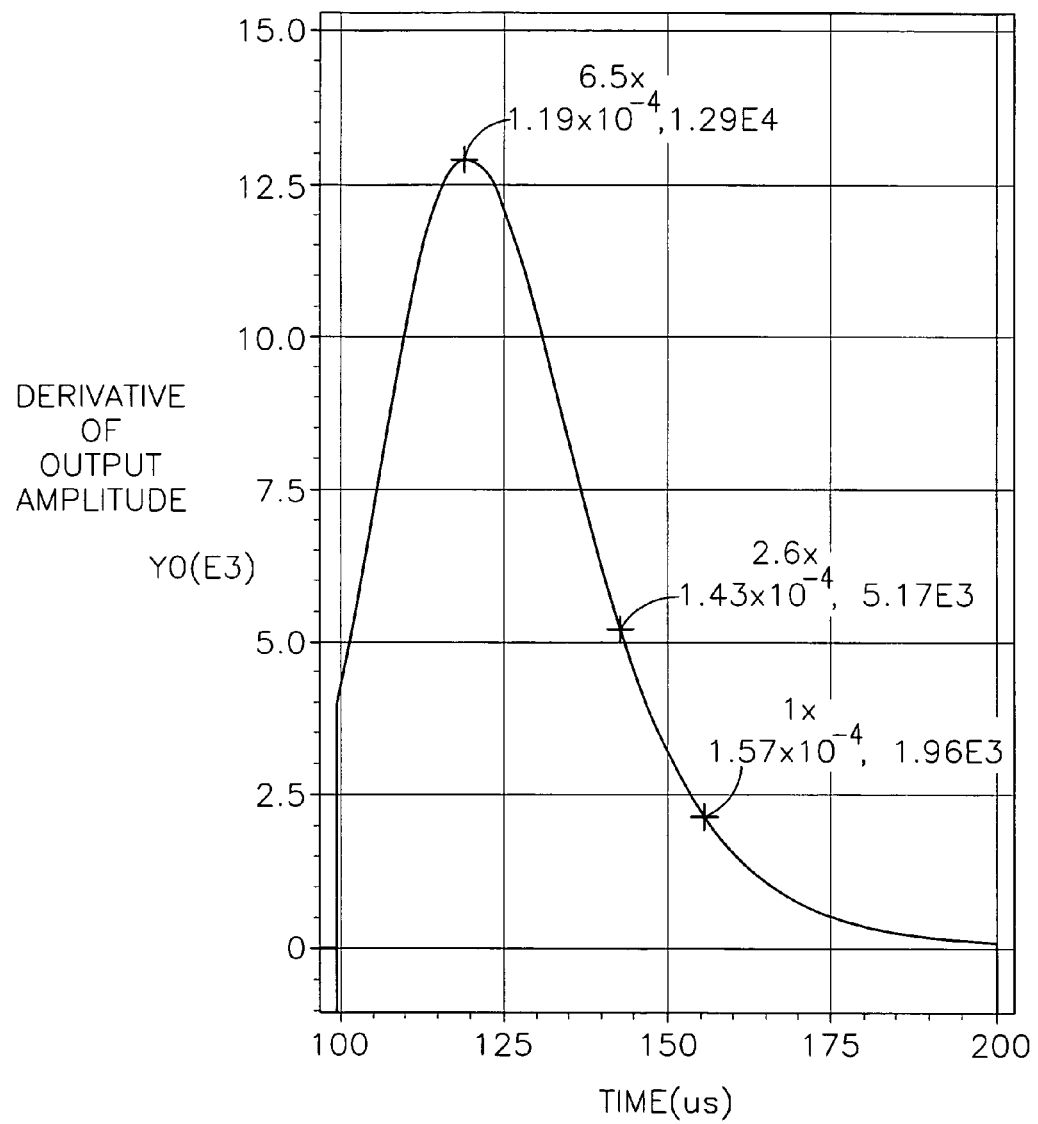
Figure 3C:
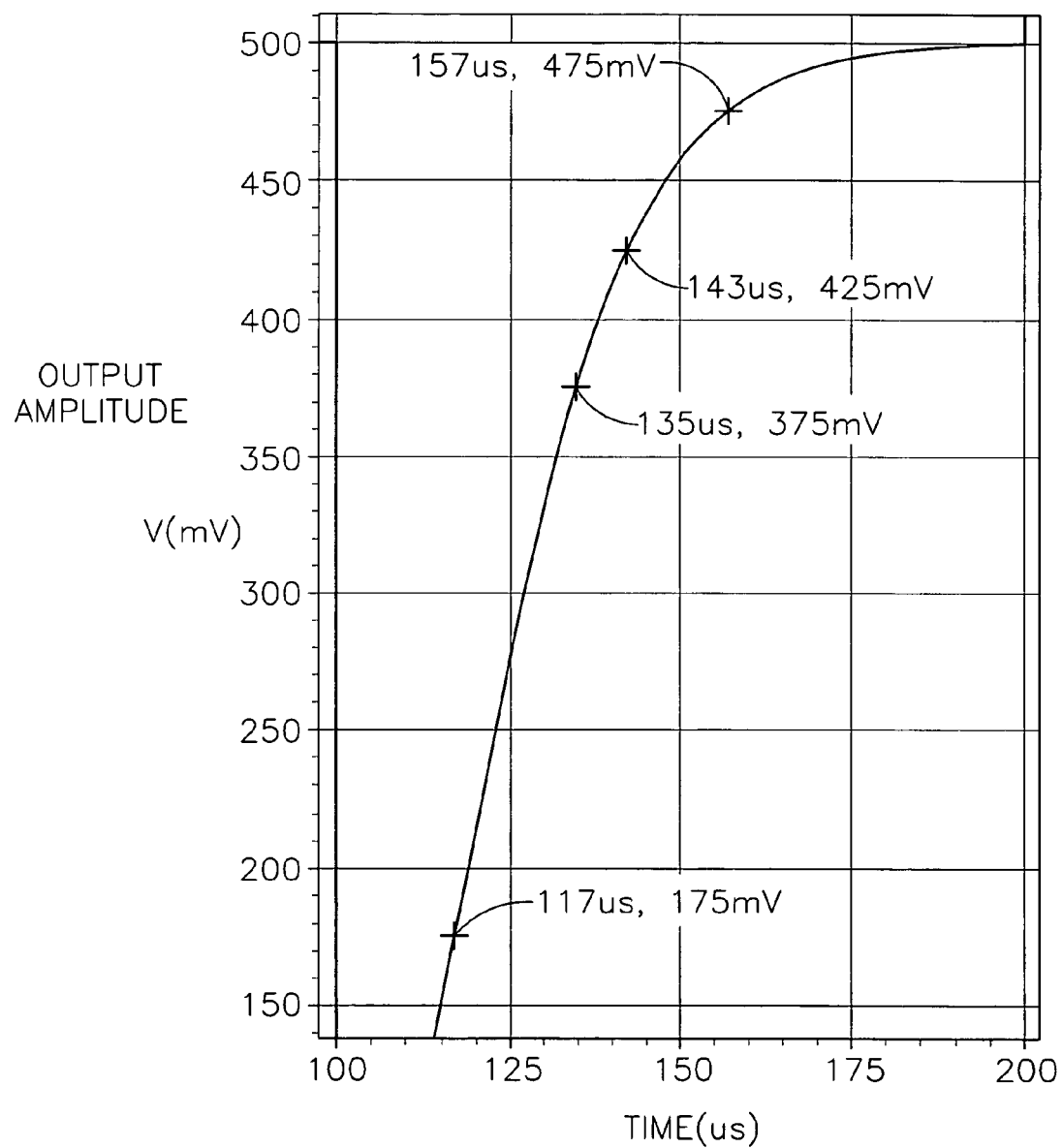
FIGS. 3C and 3D are simulation plots for a linear ramp and its derivative for a seven comparator embodiment.
Figure 3D:
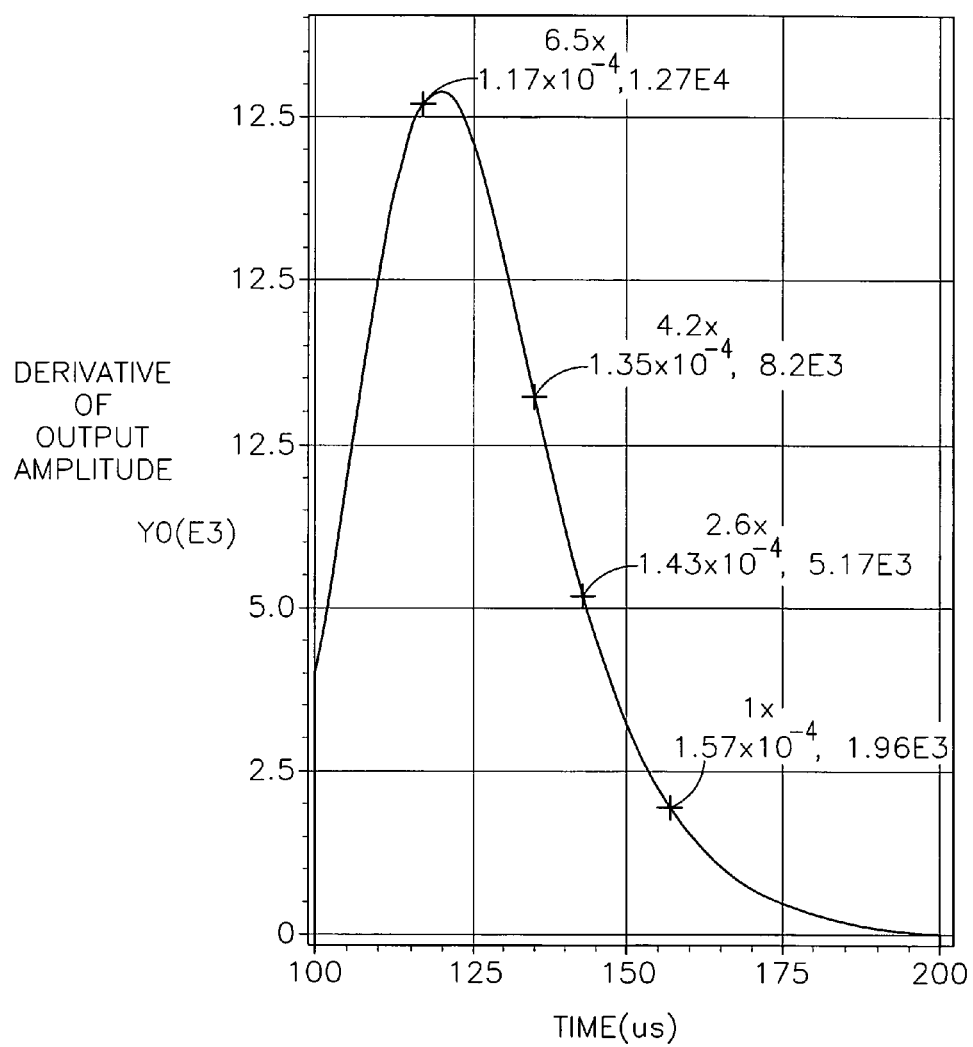

FIGS. 3A and 3B are simulation plots for a linear ramp and its derivative for a five comparator embodiment. Likewise, FIGS. 3C and 3D are simulation plots for a linear ramp and its derivative for a seven comparator embodiment. These simulation results are utilized to obtain an optimum number of reference levels and scaling steps (factor) for a given application. First, the associated derivative of the linear ramps for the ideal loop are observed. As depicted in FIGS. 3A-3D, the derivatives are summarized in Table 2.

Table 2. Derivatives of the linear ramp for the ideal loop DERIVATIVE (in linear scale)

For Five Comparators with 5-Levels:

1× corresponds to the scaling if within ±10% of the desired signal level;

2.6× corresponds to the scaling if within ±20% of the desired signal level; and 6.5× corresponds to the scaling if outside ±20% of the desired signal level.

For Seven Comparators with 7-Levels:

1× corresponds to the scaling if within ±10% of the desired signal level;

2.6× corresponds to the scaling if within ±20% of the desired signal level;

4.2× corresponds to the scaling if within ±30% of the desired signal level; and 6.5× corresponds to the scaling if outside ±30% of the desired signal level.

Choosing the number of reference levels is based on the application and the allowed complexity of the circuit. However, the separation between reference levels can not be too small otherwise, fluctuations at the peak detector output will degrade the monotonic characteristic of the outputs of the comparators. On the other hand, large differences between the reference levels will decrease the granularity of decisions fed to the filter loop.

In one embodiment, the present invention includes five comparators and five reference levels. Each comparator is connected to a reference voltage (e.g., ref 1 to ref 5). Using the derivatives of the linear ramp for the ideal loop, one can deduce that for five levels, steps of 1/2.6/6.5 may be optimal. These steps are then used as scaling factors for scaling the outputs of the comparators. However, in one embodiment, the scaling is increased further to 1/4/16 steps (that is, a binary scaling) to achieve larger swing step responses and to reduce complexity. Since the scaling factor resembles "square-law" characteristics, it is called "square-law scaling". This way, the performance of a linear ideal loop is approximated using multi comparator scheme with scaled inputs into a first order loop filter.

Figure 4:
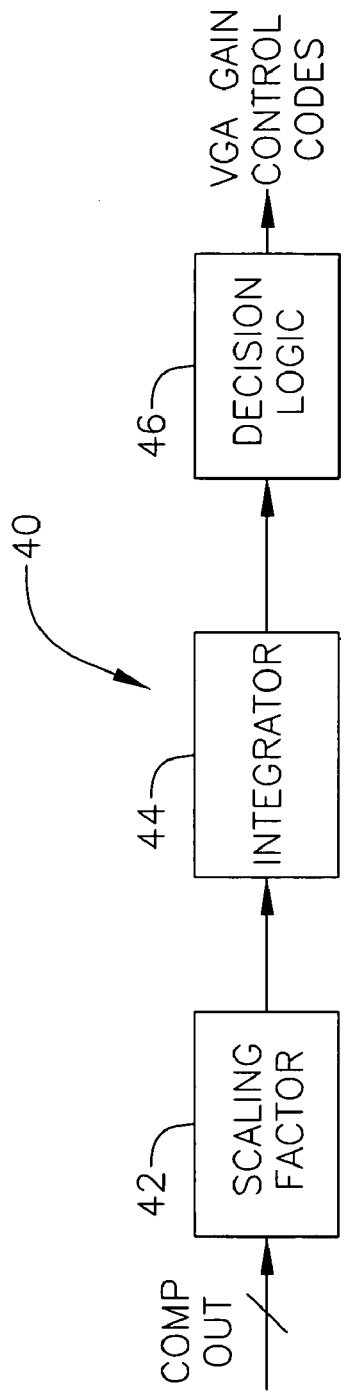
FIG. 4 is an exemplary block diagram of a loop filter, according to one embodiment of the present invention.

FIG. 4 is an exemplary block diagram of a loop filter 40, according to one embodiment of the present invention. As depicted, the outputs of the comparators are scaled by scaler 42 using a selected scaling factor (steps). The result is a scaled decision based on the outputs of the comparators. The decision output of the scaler 42 is fed to an integrator 44 that accumulates the decisions. The accumulated decision are input to a decision logic 46. The decision logic 46 increases or decreases the gain of the VGA, based on the inputs it receives from the integrator 44.

Table 3 below indicates exemplary decisions (outputs) of a scaler based on the outputs of the comparators, according to one embodiment of the invention. In one embodiment, the scaler includes bubble correction logic to change an invalid state to a valid state, as shown in Table 3.

TABLE 3

Decisions Based on the Outputs of the Comparators

| ref1 120% | ref2 110% | ref3 100% | ref4 90% | ref5 80% | Scaler Decision |
|---|---|---|---|---|---|
| 0 | 0 | 0 | 0 | 0 | +16 |
| 0 | 0 | 0 | 0 | 1 | +4 |
| 0 | 0 | 0 | 1 | 1 | +1 |
| 0 | 0 | 1 | 1 | 1 | −1 |
| 0 | 1 | 1 | 1 | 1 | −4 |
| 1 | 1 | 1 | 1 | 1 | −16 |

Figure 5:
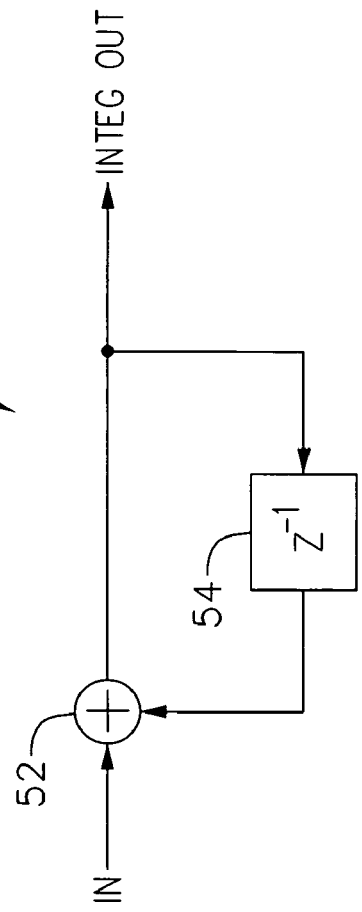
FIG. 5 is an exemplary block diagram of an integrator, according to one embodiment of the present invention.

FIG. 5 is an exemplary block diagram of an integrator 50, according to one embodiment of the present invention. As shown, the output of the scaler is fed to the integrator and added by the summer 52 to a previous output of the integrator, delayed by delay 54. This way, INTEG OUT signal is an accumulation of the current and previous outputs of the integrator.

Table 4 below shows the output of the integrator at two stages n and n−1 for given inputs.

TABLE 4

Integrator Output

| IN | INTEG OUT (n − 1) | INTEG OUT (n) |
|---|---|---|
| +4 | 0 | +4 |
| +4 | +4 | +8 |
| −1 | +8 | +7 |
| −1 | +7 | +6 |

The integrator accumulates the scaled comparators outputs over a predetermined number of cycles. The output of the integrator is then compared to a first threshold value SUM1. If the integrator output is greater than SUM1, the decision logic of FIG. 4 increments the gain of VGA. If the integrator output is less than a second threshold value SUM2, the decision logic decrements the gain of VGA.

In one embodiment, an even number of comparators, such as six comparators may be used. In this case, the AGC loop includes dedicated state to stop updating, if the Amplitude Out falls between ref3 and ref4. Therefore, the resolution of the circuit with six comparators is the same resolution of a circuit with five comparators. In the equilibrium state, there is at most ±5% settling error with respect to the desired signal level. Therefore, the sixth comparator can be eliminated while achieving the same performance of a five comparator circuit. Table 5 shows the reference levels with respect to percentage of desired signal amplitude using an even number (six) of comparators.

TABLE 5

Reference levels with respect to percentage of desired signal amplitude using six comparators

| Reference Level | Percentage of Desired Level |
|---|---|
| Ref1 | 125% |
| Ref2 | 115% |
| Ref3 | 105% |
| Ref4 | 95% |
| Ref5 | 85% |
| Ref6 | 75% |

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims.

For example, although in describing the embodiments of the present invention, five comparators are used, any number of odd (or even) comparators may be used to achieve different resolutions. Furthermore, to monitor and/or control an electrical signal, one can utilize, not only amplitude detection, but also power detection, RMS detection, and/or peak detection. Additionally, as mentioned above, a 10% separation between reference levels with respect to desired signal level is used for one embodiment of the invention. Depending on the application and the resolution required, a tighter or wider reference levels may be used with respect to the desired signal level. Also, the loop filter can be implemented using any order of filter loop in digital or analog domain. For example, a second or third order digital filter may also be utilized to implement the loop filter.

What is claimed is:

1. A method for controlling a gain of a variable gain amplifier (VGA) having an output, the method comprising:
   obtaining signal information from the VGA output;
   quantizing the signal information using a plurality of comparators;
   square law scaling the quantized signal information to produce gain control decisions; and
   adjusting the gain of the VGA in response to the gain control decisions.

2. The method of claim 1, wherein the signal information includes one or more of the group consisting of amplitude, power, RMS of the VGA output, and peak of the VGA output.

3. The method of claim 1, wherein the plurality of comparators comprises an odd number of comparators.

4. The method of claim 3, wherein the odd number of comparators comprises five comparators.

5. The method of claim 1, wherein the scaling comprises approximating operation of an ideal integrator.

6. The method of claim 1, wherein the scaling comprises scaling in accordance with five reference levels.

7. The method of claim 1, wherein the scaling comprises scaling in accordance with seven reference levels.

8. The method of claim 1, wherein the adjusting comprises digitally adjusting the gain of the VGA.

9. An automatic gain control (AGC) loop comprising:
   a variable gain amplifier (VGA) having an output;
   a peak detector for obtaining signal information from the VGA output;
   a plurality of comparators for quantizing the signal information; and
   a loop filter configured to square law scale the quantized signal information to produce gain control decisions and for adjusting a gain of the VGA in response to the gain control decisions.

10. The AGC loop of claim 9, wherein the signal information includes one or more of the group consisting of amplitude, power, RMS of the VGA output, and peak of the VGA output.

11. The AGC loop of claim 9, wherein the plurality of comparators comprises an odd number of comparators.

12. The AGC loop of claim 9, wherein the loop filter is configured to approximate operation of an ideal integrator.

13. The AGC loop of claim 9, wherein the loop filter includes a scaler configured to scale the quantized signal information in accordance with seven reference levels.

14. The AGC loop of claim 9, wherein the loop filter includes a scaler configured to scale the quantized signal information in accordance with five reference levels.

15. The AGC loop of claim 9, wherein the loop filter includes decision logic configured to digitally adjust the gain of the VGA.

16. The AGC loop of claim 9, wherein the loop filter includes an integrator.

17. The AGC loop of claim 9, wherein the loop filter includes a scaler and the scaler includes bubble correction logic configured to change an invalid state to a valid state.

18. An automatic gain control (AGC) loop comprising:
a variable gain amplifier (VGA) having an output;
means for obtaining signal information from the VGA output;
a plurality of comparators configured to quantize the signal information;
means for scaling the quantized signal information to produce gain control decisions, wherein the scaling comprises approximating operation of an ideal integrator; and
means for adjusting a gain of the VGA in response to the gain control decisions.

\* \* \* \* \*